United States Patent [19]

Eichen et al.

[11] Patent Number: 5,121,450
[45] Date of Patent: Jun. 9, 1992

[54] FIBER OPTICAL Y-JUNCTION

[75] Inventors: Elliot Eichen, Arlington; William J. Miniscalco, Sudbury; Leonard J. Andrews, Wayland, all of Mass.

[73] Assignee: GTE Laboratories Incorporated, Waltham, Mass.

[21] Appl. No.: 644,783

[22] Filed: Jan. 23, 1991

Related U.S. Application Data

[63] Continuation-in-part of Ser. No. 455,526, Dec. 22, 1989, Pat. No. 5,016,960.

[51] Int. Cl.$^5$ .............................................. G02B 6/26
[52] U.S. Cl. ...................................... 385/22; 385/45; 385/142
[58] Field of Search .............. 350/96.15, 96.17, 96.34; 372/6; 385/22, 16, 45, 142

[56] References Cited

U.S. PATENT DOCUMENTS

| | | | |
|---|---|---|---|
| 4,778,238 | 10/1988 | Hicks | 372/6 X |
| 4,886,334 | 12/1989 | Aoki | 350/96.15 |
| 4,923,279 | 5/1990 | Ainslie et al. | 372/6 X |

Primary Examiner—John D. Lee
Assistant Examiner—Stephen W. Barns
Attorney, Agent, or Firm—Lawrence E. Monks

[57] ABSTRACT

A fiber optical Y-junction device includes a 1×N optical fiber coupler connected to N fiber optic amplifier module structures constructed from a doped optical fiber. When the optical Y-junction structure contains a fiber optic amplifier, the fiber optical Y-junction device is operable as either a modulator or lossless power divider. A nonblocking optical switch is constructed by coupling M×1 optical fiber couplers to the outputs of the fiber optic amplifier module structures utilizing the fiber optical Y-junction.

3 Claims, 2 Drawing Sheets

FIBER OPTICAL Y-JUNCTION

This is a continuation-in-part of the co-pending application, Ser. No. 07/455,526 filed on Dec. 22, 1989. Now U.S. Pat. No. 5,016,960 dated May 21, 1991.

FIELD OF THE INVENTION

This invention relates to optical components and, more particularly, to an all fiber optic Y-junction and a non-blocking optical switch.

BACKGROUND OF THE INVENTION

Low loss, single mode, Y-junctions consisting of amplifier modules are important components for optical communications and optical signal processing systems. Conventional devices using single-mode Y-junctions include switches (W. E. Martin, "A new waveguide switch/modulator for integrated optics," Appl. Phys. Lett., 26 pp. 562-564 (1975)), modulators (Martin, supra), samplers (M. Izutsu, H. Haga, and T. Sueta, "Picosecond signal sampling and multiplication by using integrated tandem light modulators," J. Lightwave Technol. LT-1 pp. 285-289 (1983)), multipliers (Izutsu, supra), A/D convertors (R. A. Becker and F. J. Leonberger, "2-bit 1 Gsample/s electrooptic guided wave analog-to-digital converter," IEEE J. Quantum Electron. QE-18, pp. 1411-1413 (1982)), and logic gates (A. Lattes et al.,"An ultrafast all-optical gate," IEEE J. Quantum Electron. QE-19, pp. 1718-1723 (1983)). A significant problem associated with these devices concerns the loss of optical power in the guided mode at the Y-junction. Another difficulty relates to the coupling of optical fiber to the input and output ends of the planar waveguide.

A typical Y-junction as shown in FIG. 1 is formed by matching a single straight waveguide 10 with two other waveguides 11 and 12 that are each positioned at a half-angle $\alpha$ from the longitudinal axis of the first waveguide. The widths of the waveguides and the difference in index of refraction between the guiding and cladding layers are controlled so that the waveguides will support only one mode at a desired optical wavelength $\lambda$. Although the bend between the first waveguide and each of the angled waveguides is often discrete, other Y-junctions may have a smoothly varying radius of curvature, as disclosed by M. W. Austin in "GaAs/GaAlAs curved rib waveguides," IEEE J. Quantum Electron. QE-18, pp. 795-800 (1982) or even a more complicated discrete bend. In these conventional Y-junctions, the percentage of light lost at a junction in the waveguide depends upon the difference in the indices of refraction and $\alpha$.

For a single mode waveguide the loss always increases with increasing $\alpha$.

When used in optical communication and optical signal processing systems, planar waveguide devices are almost always fiber-pigtailed to conveniently couple light into and out of the waveguide structure. In particular, FIG. 1 shows a fiber input line 13 coupled to waveguide 10, and fiber output lines 14 and 15 coupled to waveguides 11 and 12, respectively. While coupling losses as low as 2 dB/facet have been reported by M. J. O'Mahony in "Semiconductor Laser Optical Amplifiers for Use in Future Fiber Systems," J. Lightwave Technol. LT-4 pp. 531-544 (1988), typical coupling losses are about 5 dB/facet. Fiber coupling to the waveguide requires that the length L of the waveguide, measured from the beginning of the angled section, must satisfy the equation $L \geq d/(2 \tan\alpha)$, where d is the outer diameter of the fiber. The outer diameter of most telecommunications grade fibers is 125 $\mu$m. Another consideration is that losses due to material absorption and scattering from waveguide imperfections increase as the length increases. Since it is difficult to grow the device in view of these limitations, there is a trade-off between making a device longer to reduce the bend angle and thereby reduce the loss due to bending, and making the device shorter to reduce the intrinsic loss of the waveguide. Disadvantageously, longer waveguides suffer from increased absorption losses while shorter waveguides exhibit higher junction losses due to the larger bend angles required.

In addition to simple radiation loss at a bend in a single mode waveguide, planar waveguides with branches suffer from a number of other problems. For example, the light lost due to bending depends upon polarization state, and thus the overall device may introduce polarization dependent noise. In active (pumped) semiconductors, the index of refraction is a function of carrier density and thus the throughput of the device may depend upon signal strength (saturation), wavelength, or gain.

For particular waveguide parameters, such as those disclosed by L. M. Johnson, Z. L. Liau, and S. H. Groves, in "Low-loss GainAsP buried-heterostructure optical waveguide branches and bends," Appl. Phys. Lett. 44 pp. 278-280 (1984), the angle at which half of the light is lost in a discrete bend (the 3 dB bend angle) in InGaAsP was found to be approximately 2.5°. The length of a device with a single bend of angle 2.5° would need to be at least 1.3 mm long, which is unrealistically long for conventional epitaxial growth techniques. Changing the geometry of the waveguide to a much more sophisticated bend similar to the one presented by P. D. Swanson et al. in "Low-loss semiconductor waveguide bends," Optics Letters 13 pp. 245-247 (1988) can significantly increase the 3 dB bend angle to approximately 7°, which leads to a more realistic device of length $\geq 0.5$ mm. The expected bend and material loss in other semiconductor material systems of interest (such as GaAs/GaAlAs) are expected to be similar. In dielectric materials such as $LiNbO_3$, the modes are much more loosely bound, and so half angles of less than 1° are typical. The devices fabricated from these materials are grown as bulk crystals and are very nearly transparent so that long devices on the order of a few millimeters are acceptable. Typical junction losses in practical $LiNbO_3$ devices are also approximately 3 dB.

In comparison to the energy loss experienced by a conventional Y-junction fabricated in semiconductor or dielectric materials, optical fiber couplers are able to couple light from a single fiber into two output fibers with almost no extraneous loss. For example, the extraneous loss of a good, commercially available, 1×2 optical coupler can be as low as 0.2 dB. However, fiber optical couplers with a signal loss of approximately 3 dB are typical. To compensate for the associated signal loss through the fiber optic coupler, a fiber optical amplifier module is combined with the coupler to provide a lossless all fiber optic Y-junction. The fiber optical amplifier module consists of a wavelength division multiplexed (WDM) coupler which combines the input signal light with light from a pump source within a length of standard fiber optical cable, which has been doped with a concentration of $Er^{3+}$ or another rare earth element with similar properties. The $Er^{3+}$ doped fiber length is determined so that with the amplifier unpumped (the pump signal is "off") the input signal is substantially absorbed and the output signal is blocked. However, with the amplifier pump source "on", the input light signal is intensified and a gain is obtained. The gain produced compensates for the attenuation in the signal associated with the splitting of the signal in the fiber optical coupler, and the input signal intensity of the Y-junction is preserved or amplified at the output.

OBJECTS OF THE INVENTION

It is a primary object of the present invention to obviate the above-noted and other disadvantages of the prior art.

It is a further object of the present invention to provide an all fiber optical Y-junction which exhibits high gain and low switching loss.

It is a further object of the present invention to provide a fiber optical Y-junction which is operable as a high bandwidth amplifier.

It is a yet further object of the present invention to provide a non-blocking switch constructed from all fiber optical Y-junctions that can also be used as a wavelength division demultiplexer.

SUMMARY OF THE INVENTION

In one aspect of the present invention, a fiber optical switch includes a $1 \times N$ optical fiber coupler having a single fiber input and N fiber outputs. A fiber means couples each of the N coupler outputs to a respective one of a plurality of fiber optical amplifiers. At the output of each fiber optical amplifier is coupled a fiber connecting means which serves as the optical connection to other devices.

In another aspect of the present invention, a non-blocking fiber optical switch is constructed from a plurality of the fiber optical couplers mentioned above. At the input end of the switch, a plurality of $1 \times N$ optical fiber couplers have their fiber inputs connected to a respective input port. The fiber outputs from the couplers are coupled to a respective fiber optical amplifiers by a first fiber means. At an output end of the switch, the output of each fiber optical amplifier is coupled by a second fiber means to the fiber input of one of a plurality of $M \times 1$ output optical fiber couplers. The single fiber output of each $M \times 1$ coupler is connected to an output port.

DETAILED DESCRIPTION OF THE PREFERRED EMBODIMENTS

The optical fiber couplers described herein are integrated with fiber optical amplifier modules to form a novel all-fiber device that combines the power efficiency of couplers with the modulation and gain capability of fiber optical amplifier modules. The all-fiber optical Y-junction is functionally equivalent to a conventional planar waveguide Y-junction, but has a number of structural and operational advantages over conventional devices.

The novel fiber optical Y-junction device does not suffer from any power loss due to a bent waveguide as in conventional Y-junctions, and provides a rugged and reliable switching capability, due to the all-fiber nature of the switch. In addition, the all-fiber Y-junction can be used as a modulator, switch, or other signal processing device when the fiber optic amplifier is pumped to provide gain.

Figure 2:
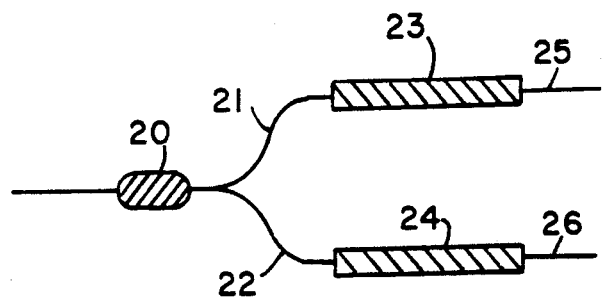
FIG. 2 shows an all fiber optical Y-junction constructed in accordance with the present invention.

FIG. 2 shows an all-fiber optical Y-junction including a $1 \times 2$ fiber coupler 20 having two fiber output lines 21 and 22 coupled to two separate fiber optical amplifier modules 23 and 24, respectively. Fiber optical amplifier modules 23 and 24 are coupled at their output ends to fiber lines 25 and 26, respectively. A particularly advantageous feature of the devices described herein is that the fiber optical amplifiers are constructed from fiber optic cable that has been doped with a concentration of $Er^{3+}$, thus providing an amplifier of fiber construction.

In one embodiment of the device herein described, the fiber optic cable is doped with a concentration of $Er^{3+}$ of approximatey 1000 ppm. The fiber optic cable has a core size of 7 micrometers, and a numerical aperture of 0.13. To facilitate low loss splicing, the amplifier fiber is purposely fabricated to be close in mode field diameter to standard telecommunications fiber. A pumping light source is contained within the fiber optical amplifier module such that the input signal light is combined with the pump source light, and consequently the input light signal is excited to a higher energy state within the doped fiber, producing a gain in the signal. In one embodiment of the device herein described, the pump source produces light with a wavelength of 980 nm, and amplifies input light signals within a wavelength range from 1520 nm to 1600 nm.

The fiber optical amplifier modules can be pumped to selectively turn on or off the amplifier, thereby operating as a modulator, or as an amplifier providing gain. When the fiber optical amplifier module amplifier is off, all of the light propagating through the doped section of the fiber optic cable is absorbed due to the high transmission loss coefficient of the amplifier, which is on the order of 20 dB.

Alternatively, when the amplifier is pumped, the amplifier is capable of achieving variable gain.

Figure 1:
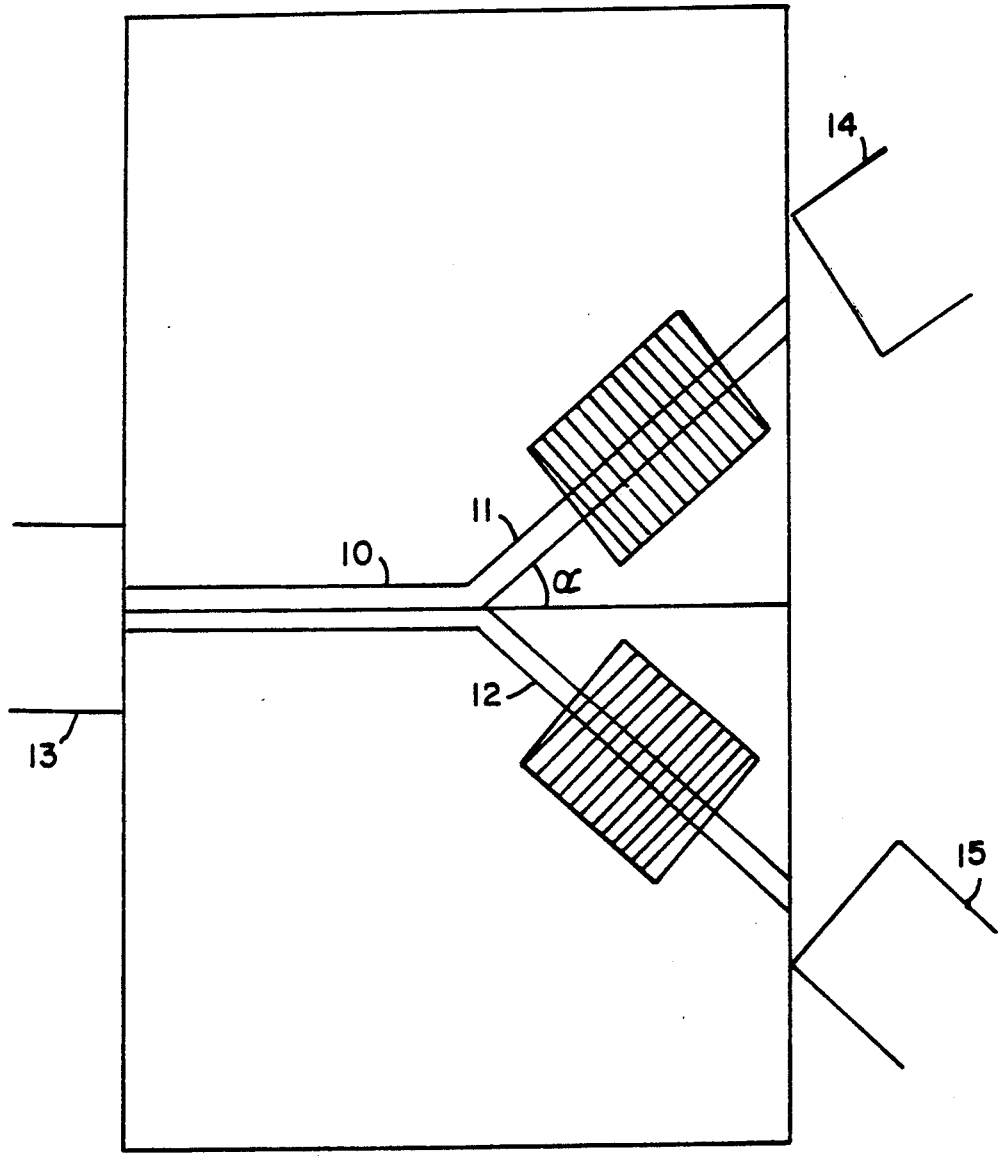
FIG. 1 is a structural diagram of a conventional optical Y-junction.

Referring to the conventional Y-junction in FIG. 1, the separation between output fibers is clearly established by the device length and bend angle, while the use of an all-fiber optical amplifier module in conjunction with the fiber optical coupler does not suffer from the same restrictions and the separation between fiber optic amplifier modules in the novel fiber optic Y-junction disclosed herein allows greater flexibility in fiber positioning. This greatly eases the problem of packaging, and in particular the difficultly in connecting fiber pigtails that is especially severe in multiport devices, as discussed by P. J. Duthie in "New Architecture for Large Integrated Optical Switch Arrays," Topical Meeting on Photonic Switching, Incline Village, Nev., (1987). Although the fiber optical Y-junction is shown for exemplary purposes in FIG. 2 as a $1 \times 2$ optical Y-junction, the structure is clearly extendable to include a $1 \times N$ fiber coupler and N fiber optic amplifier module structures. This capability is useful in optical switching architectures, as explained in the following discussion of FIG. 3.

Figure 3:
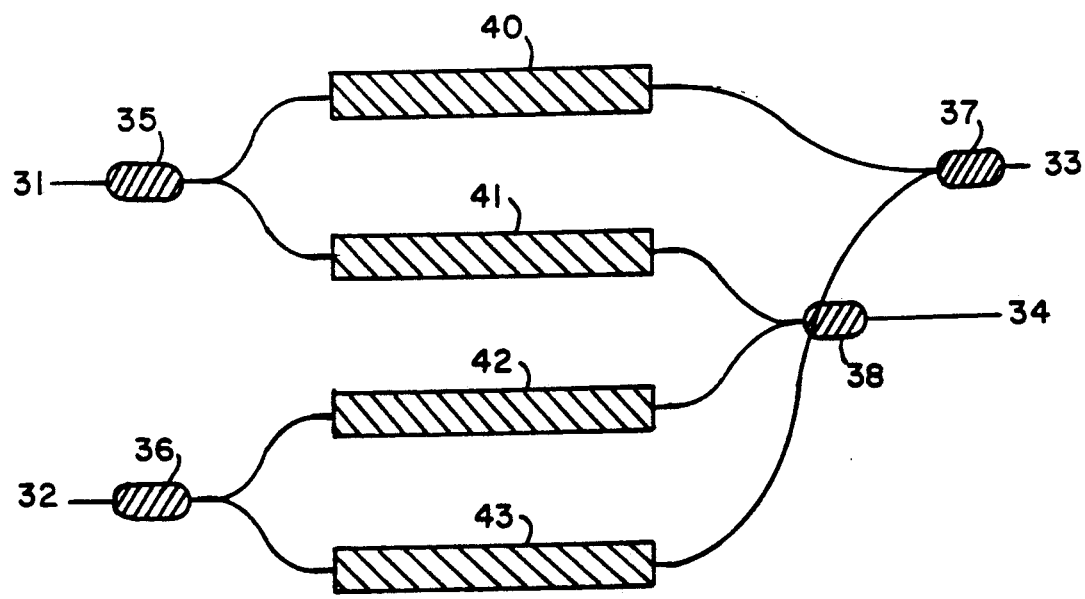
FIG. 3 is a structural representation of a $2 \times 2$ non-blocking optical switch that uses the all fiber optical Y-junction of FIG. 2.

FIG. 3 is a structural diagram of a 2×2 non-blocking optical switch constructed in accordance with the present invention. At an input end, the switch includes two 1×2 input fiber couplers 35 and 36 having their inputs connected to input ports 31 and 32, respectively. The fiber output lines from these input couplers are each coupled to a respective one of the four fiber optical amplifier modules depicted as 40, 41, 42, and 43 in the drawing. Again, the optical amplifiers are constructed from doped fiber optic cable. At an output end, two 2×1 fiber output couplers 37 and 38 are coupled at their inputs to the output of a respective one of the fiber optical amplifiers 40, 41, 42, and 43. The outputs of the couplers each serve as an output port. The interconnection between the fiber optic amplifiers 40, 41, 42, and 43 and the output couplers 37 and 38 is such that any desired optical path connection between input ports 31 and 32 and output ports 33 and 34 is possible. This fiber optic device also offers high isolation (greater than 20 dB) from crosstalk, less intermodulation distortion, and low return power loss.

As an extension to FIG. 3, a generalized non-blocking switch is possible where a plurality of parallel 1×N input fiber couplers are connected to a plurality of fiber optic amplifier modules constructed from $Er^{3+}$ doped fiber. At an output end of the switch, a plurality of M×1 fiber couplers serve to couple the fiber optic amplifier modules to the output ports. A significant advantage of the novel fiber optical Y-junction over conventional Y-junctions is that the number of possible branches is much higher. For example, consider the loss through a monolithic 8 port device, compared with a fiber optic 8 port device constructed in accordance with the present invention. If each junction in the monolithic device has only a 2 dB loss (which is quite good), the total transmission loss through any one port is 6 dB, or 75%. In contrast, if the junction loss in an 8 port fiber optic device is 0.5 dB (not difficult to achieve), then the total transmission loss through any one port would be 1.5 dB, or only 30%. Furthermore, a reduction in junction loss to 0.1 dB would result in a total transmission loss of 0.3 dB, or 75%, through any one port. In an optical Y-junction where the structure is a fiber optic amplifier module, the effect of reducing the junction loss also reduces the power requirements required to achieve a given net single pass gain, which improves the efficiency of the device.

What has been shown and described herein is a novel fiber optical Y-junction formed by coupling fiber optic amplifier modules constructed from $Er^{3+}$ doped fiber to fiber couplers. The advantages of this device over previously existing devices are:

ease of fabrication and packaging
no radiation losses due to waveguide branching,
no practical limits to the number of output branches, and
reduction in polarization sensitivity.

Furthermore, if the all-fiber device is fabricated with fiber optical amplifiers, the device can act as a lossless power divider (or a power divider with gain) when all of the amplifiers coupled to a particular fiber coupler are simultaneously pumped. Alternatively, with each amplifier selectively pumped, the device can operate as either a modulator or a non-blocking switch. The all-fiber device is also operable as a wavelength division multiplexer.

While there has been shown and described what are at present considered the preferred embodiments of the present invention, it will be obvious to those skilled in the art that various changes and modifications may be made therein without departing from the scope of the invention as defined by the appended claims.

What is claimed is:

1. An optical device for branching a single input port to one or more of a plurality of output ports, comprising:
  a 1×N optical fiber coupler having a fiber input coupled to said input port and N fiber outputs;
  a plurality of fiber optic amplifier modules each having an input for receiving an optical signal and an output for transmitting an optical signal including means for selectively optically pumping said fiber amplifier modules so that each module is capable of achieving variable gain/loss;
  means for fiber coupling each of the fiber outputs of said optical fiber coupler to the input of a respective one of said fiber amplifier modules;
  whereby said input signal to a fiber optic amplifier module is amplified at the output when the module is pumped and no output signal is transmitted when the fiber optic amplifier is not pumped.

2. The optical device as recited in claim 1 further including:
  cable means doped with a positive ionic element from the rare earth elements.

3. The optical device as recited in claim 2 wherein said ionic element is $Er^{3+}$.

* * * * *